United States Patent
Kyung

(10) Patent No.: US 7,457,192 B2
(45) Date of Patent: Nov. 25, 2008

(54) SEMICONDUCTOR MEMORY DEVICE AND MODULE FOR HIGH FREQUENCY OPERATION

(75) Inventor: Kye-hyun Kyung, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 85 days.

(21) Appl. No.: 11/607,311

(22) Filed: Dec. 1, 2006

(65) Prior Publication Data
US 2007/0076517 A1 Apr. 5, 2007

Related U.S. Application Data

(63) Continuation-in-part of application No. 10/894,823, filed on Jul. 19, 2004, now Pat. No. 7,170,818.

(30) Foreign Application Priority Data

Jul. 21, 2003 (KR) ............... 10-2003-0049770
May 24, 2004 (KR) ............... 10-2004-0036908

(51) Int. Cl.
*G11C 8/00* (2006.01)
(52) U.S. Cl. .............. 365/233; 365/233.11; 365/233.19
(58) Field of Classification Search ................ 365/233, 365/233.11, 233.12, 233.15, 233.16, 233.17, 365/233.19, 191
See application file for complete search history.

(56) References Cited

U.S. PATENT DOCUMENTS

| 6,151,270 | A | 11/2000 | Jeong |
| 6,198,674 | B1 | 3/2001 | Kim |
| 6,222,792 | B1 | 4/2001 | Hanzawa et al. |
| 6,427,197 | B1 * | 7/2002 | Sato et al. ................... 711/169 |
| 6,807,613 | B1 | 10/2004 | Keeth et al. |
| 7,251,171 | B2 * | 7/2007 | Nishimura et al. ......... 365/191 |
| 2003/0218916 | A1 | 11/2003 | Kang |

* cited by examiner

*Primary Examiner*—Dang T Nguyen
(74) *Attorney, Agent, or Firm*—Mills & Onello LLP

(57) ABSTRACT

The present invention relates to a synchronous semiconductor memory device with double data rate, and more particularly, to a synchronous semiconductor memory device for inputting and outputting data using a free-running clock and inserting a preamble indicative of start of data into the outputted data. A semiconductor memory device of the present invention receives a data read command from the exterior of the memory device in response to a predetermined clock signal inputted from the exterior, and outputting data including a preamble in response to the clock signal.

13 Claims, 20 Drawing Sheets

SEMICONDUCTOR MEMORY DEVICE AND MODULE FOR HIGH FREQUENCY OPERATION

RELATED APPLICATION

This application is a continuation-in-part application of U.S. patent application Ser. No. 10/894,823, filed Jul. 19, 2004 now U.S. Pat. No. 7,170,818, which relies for priority on Korean Patent Application Nos. 2003-49770, filed on Jul. 21, 2003 and 2004-36908, filed on May 24, 2004. The contents of all of the above documents are incorporated herein in their entirety by reference.

BACKGROUND OF THE INVENTION

1. Field of the Invention

The present invention relates to a double data rate synchronous semiconductor memory device, and more particularly, to a synchronous semiconductor memory device for inputting and outputting data using a free-running clock and inserting into the outputted data a preamble notifying a start of data.

2. Description of the Related Art

Generally, a synchronous semiconductor memory device receives and outputs data in synchronization with an external system clock. Synchronous semiconductor memory devices are classified into single data rate synchronous semiconductor memory devices (hereinafter, referred to as SDR SDRAM) and double data rate synchronous semiconductor memory devices (hereinafter, referred to as DDR SDRAM).

While the SDR SDRAM operates in synchronization with rising edges or falling edges, the DDR SDRAM operates in synchronization with both rising edges and falling edges. Accordingly, the operation frequency of the DDR SDRAM is double that of the SDR SDRAM with respect to the same system clock. Since the DDR SDRAM transmits data at high frequency, a data strobe signal DS is used to latch such high frequency data.

A data strobe signal DS is generated by a data source when data is outputted. That is, when data is inputted from a master such a chipset or hub to a DDR SDRAM, the data strobe signal DS is generated by the master and inputted to the DDR SDRAM along with data. On the contrary, when data is outputted from the DDR SDRAM, the data strobe signal DS is generated in the DDR SDRAM and outputted to the master along with data. The side that receives the data recognizes input of data by the data strobe signal DS. That is, the data strobe signal DS plays a role of a synchronization clock for the semiconductor memory device to recognize data.

Such a data strobe signal DS keeps a high impedance state (between a high level and a low level) before the data are outputted from the data source. The data strobe signal DS is changed to a low level before one cycle from the time that data is outputted. The data strobe signal DS is toggled according to variation of a window of the data. After the data is outputted completely, the data strobe signal DS returns to a high impedance state.

FIG. 1 illustrates that a conventional semiconductor memory device using a data strobe signal receives and outputs data. Referring to FIG. 1, the conventional semiconductor memory device receives a command/address signal CA from a master in response to an externally input system clock CLK, and receives and outputs data DQ from and to the master using the data strobe signal DS generated by the data source.

FIG. 2 is a time chart of signals when data are inputted to the conventional semiconductor memory device shown in FIG. 1, that is, when the conventional semiconductor memory device shown in FIG. 1 receives a write command Write. FIG. 3 is a time chart of signals when the conventional semiconductor memory device shown in FIG. 1 receives a read command Read.

As shown in FIGS. 2 and 3, when the conventional semiconductor memory device receives a write command Write, the conventional semiconductor memory device receives data Q0-Q3 in synchronization with the center of the data strobe signal DS inputted from the master. When the conventional semiconductor memory device receives a read command Read, the conventional semiconductor memory device outputs the data strobe signal DS generated by the semiconductor memory device and the data Q0-Q3 in synchronization with an edge of the data strobe signal DS. However, since such a conventional semiconductor memory device does not have enough setup and hold time margins when receiving and outputting data, this limits data input/output operations of a memory that is required to have high speed.

FIG. 4 illustrates a memory module consisting of the conventional semiconductor memory device shown in FIG. 1, and particularly, an embodiment of a memory module suitable for a structure of a stub bus or a point-to-point bus.

Here, the structure of the stub bus or the point-to-point bus is a structure in which memories 502 and 506 included in memory modules 500 and 504 are connected to a connection line 508 on a board by point-to-point in connection structure for communication between memory modules, as shown in FIG. 5A. On the other hand, a short-loop-through (SLT) bus structure shown in FIG. 5B is a structure in which connection line 518 between memory modules 510 and 514 is connected via memories 512 and 516 of the memory modules 510 and 514. In general, the stub bus is not suitable for high frequency operation of 667 MHz or more. On the contrary, the SLT bus is a bus structure suitable for the high frequency operation of 667 MHz or more.

Referring to FIG. 4, the conventional memory module 400 includes a plurality of memories 100 and a register/PLL 402 for supplying the memories 100 with a system clock CLKm and an externally input command/address signal CAm and having a PLL circuit for synchronizing the signals. Data lines for inputting and outputting data DQ and signal lines for inputting and outputting the data strobe signal DS are connected to memories 100. However, since a path of the system clock CLKm supplied to the memories 100 and a path of the data strobe signal DS are set to be different from each other and the data strobe signal is individually connected to each memory 100, the path of the data strobe signal DS is comparatively short. On the other hand, the system clock CLKm has a comparatively long path through which the system clock CLKm is supplied from memories 406 and 408 near to the register/PLL 402 to memories 404 and 410 far from the register/PLL 402. Accordingly, if the operation frequency is increased, time skew can be caused by time delay of the system clock supplied to the memories of the memory module.

SUMMARY OF THE INVENTION

Accordingly, the present invention is directed to a semiconductor memory device that substantially obviates one or more problems due to limitations and disadvantages of the related art.

In order to overcome the problems described above, it is an object of the present invention to provide a semiconductor memory device for receiving and outputting data in synchronization with a free-running clock instead of a data strobe signal, in which the outputted data include a preamble notifying a start of the data. The present invention also provides a memory module using the semiconductor memory device.

In accordance with the present invention, there is provided a semiconductor memory device receiving an externally input data read command and an externally input address signal in response to a predetermined externally input clock signal, and outputting data including a preamble in response to the clock signal.

In one aspect, the invention is directed to a semiconductor memory device that includes a memory cell for storing data, an internal clock generator for generating a first internal clock signal, a second internal clock signal or a third internal clock signal in response to a mode control signal and a command/address input unit for transferring an externally input command/address signal to inside of the semiconductor memory device in synchronization with the first internal clock signal. The semiconductor memory device further includes a controller for outputting a plurality of control signals and an address signal in response to the command/address signal so as to control operation of the semiconductor memory device. The controller has a mode register for generating the mode control signal. The semiconductor memory device further includes a control circuit for selecting between a first mode and a second mode in response to the mode control signal. In the first mode the control circuit selects both of an externally input first clock signal and an externally input second clock signal and in the second mode the control circuit selects only one of the externally input first clock signal and the externally input second clock signal. The semiconductor memory device further includes a data input unit for receiving data in synchronization with the second internal clock signal, a data output unit for outputting data including a preamble in synchronization with the third internal clock signal, and a data processing unit for storing data inputted through the data input unit in the memory cell according to the control signals of the control unit, or transferring the data from the memory cell to the data output unit. The preamble is added to a header of the outputted data and is indicative of start of the data. In the first mode the internal clock generator generates the first internal clock signal in response to the externally input first clock signal, and generates the second internal clock signal or the third internal clock signal in response to a predetermined control signal and the externally input second clock signal. In the second mode the internal clock generator generates the first internal clock signal in response to the one of the externally input first clock signal and the externally input second clock signal, and generates the second internal clock signal or the third internal clock signal in response to a predetermined control signal and the one of the externally input first clock signal and the externally input second clock signal.

In one embodiment, the preamble added to each data outputted through the data lines has the same level.

In one embodiment, the level of the preamble is a high level. In another embodiment, the level of the preamble is a low level.

In one embodiment, the preamble added to data outputted through neighboring data lines among the plurality of data lines has different level.

In one embodiment, in the second mode, the semiconductor memory device generates the first to third internal clock signals using the externally input first clock signal.

In one embodiment, in the second mode, the semiconductor memory device generates the first to third internal clock signals using the externally input second clock signal.

In one embodiment, if data including the preamble from the outside, the semiconductor memory device detects the preamble included in the input data unit to latch an input data.

In another embodiment, the data input unit further includes a preamble detecting circuit for latching inputted data including the preamble and a data input buffer for inputting an input data in synchronization with the second internal clock signal to the data input unit according to a preamble detection signal from the preamble detection circuit.

In another aspect, the present invention is directed to a semiconductor memory device inputting and outputting data including a preamble. The semiconductor memory device includes a memory cell for storing data through a plurality of data lines, an internal clock generator for generating a first internal clock signal, a second internal clock signal or a third internal clock signal in response to a mode control signal and a command/address input unit for transferring an externally input command/address signal to inside of the semiconductor memory device in synchronization with the internal command/address clock signal. The semiconductor memory device further includes a controller for outputting a plurality of control signals and an address signal in response to the command/address signal so as to control operation of the semiconductor memory device. The controller has a mode register for generating the mode control signal. The semiconductor memory device further includes a control circuit for selecting between a first mode and a second mode in response to the mode control signal. In the first mode the control circuit selects both of an externally input first clock signal and an externally input second clock signal and in the second mode the control circuit selects only one of the externally input first clock signal and the externally input second clock signal. The semiconductor memory device further includes a data input unit for receiving data including a preamble in synchronization with any one of the plurality of internal clock signals, a data output unit for outputting data including a preamble in synchronization with any one of the plurality of internal clock signals and a data processing unit for storing data inputted through the data input unit in the memory cell according to a control signal of the control unit, or transferring the data from the memory cell to the data output unit. The data output unit comprises a preamble generator for generating the preamble and adding the preamble to the output data. In the first mode the internal clock generator generates the first internal clock signal in response to the externally input first clock signal, and generates the second internal clock signal or the third internal clock signal in response to a predetermined control signal and the externally input second clock signal. In the second mode the internal clock generator generates the first internal clock signal in response to the one of the externally input first clock signal and the externally input second clock signal, and generates the second internal clock signal or the third internal clock signal in response to a predetermined control signal and the one of the externally input first clock signal and the externally input second clock signal.

In one embodiment, the data input unit includes a preamble detector for detecting a preamble of inputted data and generating a preamble detecting signal, a clock selector for receiving the plurality of internal clock signals and selecting and outputting one of the plurality of internal clock signals in response to the preamble detecting signal and a data input buffer for receiving inputted data in synchronization with the internal clock signal selected by the clock selector. In another embodiment, the plurality of internal clock signals have different phases from each other. In another embodiment, the plurality of internal clock signals have phase difference of 45°.

In another aspect, the invention is directed to a semiconductor memory device receiving an externally input clock signal, receiving an externally input data read command in response the external clock signal, and outputting data including a preamble in response to the clock signal, wherein the preamble is added to a header of the outputted data and indicates a start of the data.

In one embodiment, the preamble added to each data outputted through the data lines has the same level. In one embodiment, the level of the preamble is a high level. Alternatively, the level of the preamble is a low level.

In one embodiment, the preamble added to data outputted through neighboring data lines among the plurality of data lines has different levels.

In one embodiment, if data includes the preamble from the outside, the semiconductor memory device detects the preamble included in the input data unit to latch an input data.

The semiconductor memory device can further comprise: a control logic for generating a plurality of internal clock signals in response to the clock signal, receiving an externally input command/address signal in synchronization with the internal clock signals, and outputting an address signal to input and output data and a predetermined control signal; a memory cell for storing data in response to the address signal and the control signal or latching and outputting the stored data; and a data input/output unit for adding the preamble to the data outputted from the memory cell and outputting the data with the added preamble in response to the control signal and one internal clock signal, and storing the data received in the memory cell, In one embodiment, the clock signal includes a first clock signal and a second signal that are different from each other, a first internal clock signal for synchronizing the command/address signal is generated in response to the first clock signal, and a second internal clock signal and a third internal clock signal being a synchronizing signal for input/output data is generated in response to the second clock signal and the control signal. The data input/output unit can comprise a preamble generator for adding the preamble to the outputted data. The data input/output unit can further comprise a preamble detector for detecting the preamble and latching inputted data.

In another aspect, the invention is directed to a semiconductor memory device comprising: a memory cell for storing data; an internal clock generator for generating a first internal clock signal in response to an externally input first clock signal, and generating a second internal clock signal or a third internal clock signal in response to a predetermined control signal and an externally input second clock signal; a command/address input unit for transferring an externally input command/address signal to inside of the semiconductor memory device in synchronization with the first internal clock signal; a controller for outputting a plurality of control signals and an address signal in response to the command/address signal so as to control operation of the semiconductor memory device; a data input unit for receiving data in synchronization with the second internal clock signal; a data output unit for outputting data including a preamble in synchronization with the third internal clock signal; and a data processing unit for storing data inputted through the data input unit in the memory cell according to the control signals of the control unit, or transferring the data from the memory cell to the data output unit, wherein the preamble is added to a header of the outputted data and is indicative of start of the data. The preamble added to each data outputted through the data lines can have the same level. In one embodiment, the level of the preamble is a high level. Alternatively, the level of the preamble is a low level. In one embodiment, the preamble added to data outputted through neighboring data lines among the plurality of data lines has different levels. The semiconductor memory device can generate the first to third internal clock signals using only the first clock signal. In one embodiment, the semiconductor memory device generates the first to third internal clock signals using only the second clock signal. In one embodiment, if data includes the preamble from the outside, the semiconductor memory device detects the preamble included in the input data unit to latch an input data. The data input unit can further comprise: a preamble detecting circuit for latching inputted data including the preamble; and a data input buffer for inputting an input data in synchronization with the second internal clock signal to the data input unit according to a preamble detection signal from the preamble detection circuit.

In another aspect, the invention is directed to a semiconductor memory device inputting and outputting data including a preamble, the semiconductor memory device comprising: a memory cell for storing data through a plurality of data lines; an internal clock generator for generating a internal command/address clock signal in response to an externally input first clock signal, and generating a plurality of internal clock signals in response to a predetermined control signal and an externally input second clock signal; a command/address input unit for transferring an externally input command/address signal to inside of the semiconductor memory device in synchronization with the internal command/address clock signal; a controller for outputting a plurality of control signals and an address signal in response to the command/address signal so as to control operation of the semiconductor memory device; a data input unit for receiving data including a preamble in synchronization with any one of the plurality of internal clock signals; a data output unit for outputting data including a preamble in synchronization with any one of the plurality of internal clock signals; and a data processing unit for storing data inputted through the data input unit in the memory cell according to a control signal of the control unit, or transferring the data from the memory cell to the data output unit. The data output unit comprises a preamble generator for generating the preamble and adding the preamble to the output data.

In one embodiment, the data input unit comprises: a preamble detector for detecting a preamble of inputted data and generating a preamble detecting signal; a clock selector for receiving the plurality of internal clock signals and selecting and outputting one of the plurality of internal clock signals in response to the preamble detecting signal; and a data input buffer for receiving inputted data in synchronization with the internal clock signal selected by the clock selector. In one embodiment, the plurality of internal clock signals have different phases from each other. In one embodiment, the plurality of internal clock signals have phase difference of 45°.

In another aspect, the invention is directed to a memory module having a plurality of semiconductor memory devices for receiving a command/address signal and receiving and outputting data in response to one clock signal inputted, the memory module comprising: a data line connected to the plurality of semiconductor memory devices and being a path for receiving and outputting data; a command/address line being a path for transferring the command/address signal via the semiconductor memory devices; and a clock line being a path for supplying the semiconductor memory devices with the clock signal. Data outputted through the data line includes a preamble indicative of start of the data.

In one embodiment, data inputted through the data line further includes a preamble indicative of start of the data.

In one embodiment, the clock line is connected to each of the plurality of semiconductor memory devices independently.

In one embodiment, the clock line is connected via all the plurality of semiconductor memory devices.

In one embodiment, the memory module further comprises a register circuit including a phase lock loop circuit.

In one embodiment, the memory module has a stub bus structure.

In one embodiment, the memory module has a short-loop-through bus structure.

In another aspect, the invention is directed to a memory module having a plurality of semiconductor memory devices for receiving a command/address signal in response to an externally input first clock signal and receiving and outputting data in response to a second clock signal, the memory module comprising: a data line connected to the plurality of semiconductor memory devices and being a path for receiving and outputting data; a command/address line being a path for transferring the command/address signal via the semiconductor memory devices; a first clock line being a path for supplying the semiconductor memory devices with the first clock signal; and a second clock line being a path for supplying the semiconductor memory devices with the second clock signal. Data outputted through the data line includes a preamble indicative of start of the data.

In one embodiment, data inputted through the data line further includes a preamble indicative of start of the data.

In one embodiment, the first clock line is connected via all the plurality of semiconductor memory devices.

In one embodiment, the second clock line is connected to each of the plurality of semiconductor memory devices independently.

In one embodiment, the memory module further comprises a register circuit including a phase lock loop circuit.

In one embodiment, the memory module has a stub bus structure.

In one embodiment, the memory module has a short-loop-through bus structure.

In another aspect, the invention is directed to a memory module having a plurality of semiconductor memory devices, the memory module comprising: a channel for connecting to an exterior of the memory module; a hub connected to the channel, for transferring a clock signal and a command/address signal inputted from the exterior through the channel to the semiconductor memory devices and allowing the semiconductor memory devices to receive and output data from and to the exterior; a data line connected to the hub and the plurality of semiconductor memory devices and being a path for transferring data; a command/address line being a path for transferring the command/address signal via the semiconductor memory devices from the hub; and a clock line for supplying the semiconductor memory devices with the clock signal. Data outputted to the exterior through the channel includes a preamble indicative of start of the data.

In one embodiment, data inputted from the exterior through the channel further includes a preamble indicative of start of the data.

In one embodiment, the clock line is connected to each of the plurality of semiconductor memory devices independently.

In one embodiment, the clock line is connected via all the plurality of semiconductor memory devices.

In another aspect, the invention is directed to a memory module having a plurality of semiconductor memory devices, the memory module comprising: a channel for connecting to an exterior of the memory module; a hub connected to the channel, for transferring a first clock signal, a second clock signal and a command/address signal inputted through the channel to the semiconductor memory devices and allowing the semiconductor memory devices to receive and output data from and to the exterior through the channel; a data line connected to the hub and the plurality of semiconductor memory devices and being a path for transferring data; a command/address line being a path for transferring the command/address signal via the semiconductor memory devices from the hub; and a first clock line being a path for supplying the semiconductor memory devices with the first clock signal; and a second clock line being a path for supplying the semiconductor memory devices with the second clock signal. Data outputted to the exterior through the channel includes a preamble indicative of start of the data.

In one embodiment, data inputted from the exterior through the channel further includes a preamble indicative of start of the data.

In one embodiment, the first clock line is connected via all the plurality of semiconductor memory devices.

In one embodiment, the second clock line is connected to each of the plurality of semiconductor memory devices independently.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1:
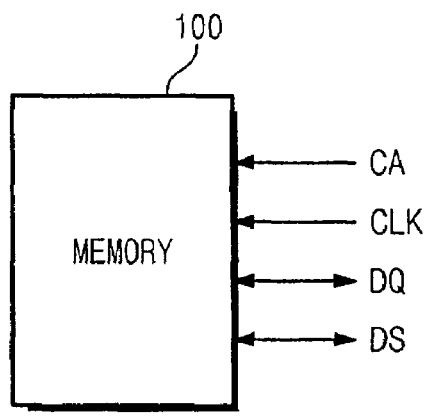
FIG. 1 contains a block diagram illustrating a conventional semiconductor memory device using data strobe signal receiving and outputting data.
Figure 2:
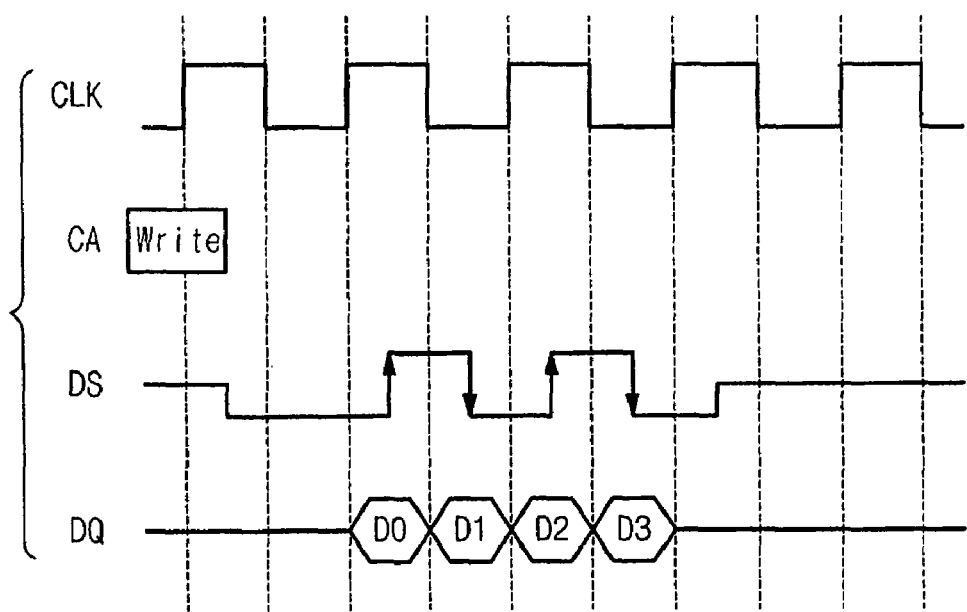
FIG. 2 is a timing diagram of signals when the conventional semiconductor memory device shown in FIG. 1 receives a write command.
Figure 3:
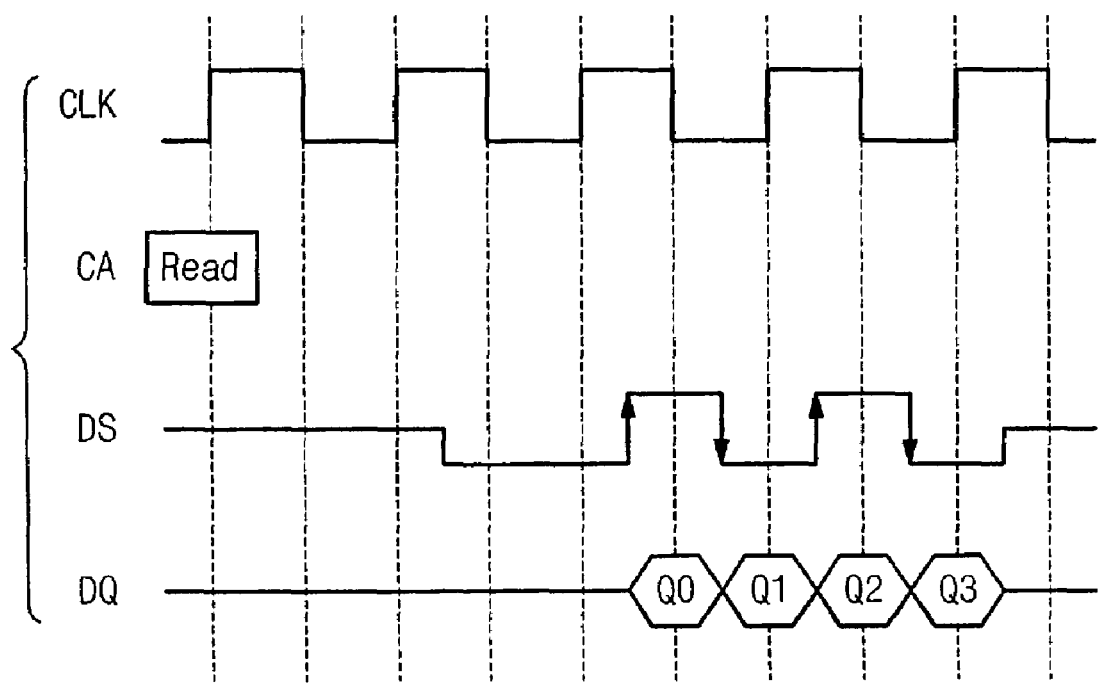
FIG. 3 is a time chart of signals when the conventional semiconductor memory device shown in FIG. 1 receives a read command.
Figure 4:
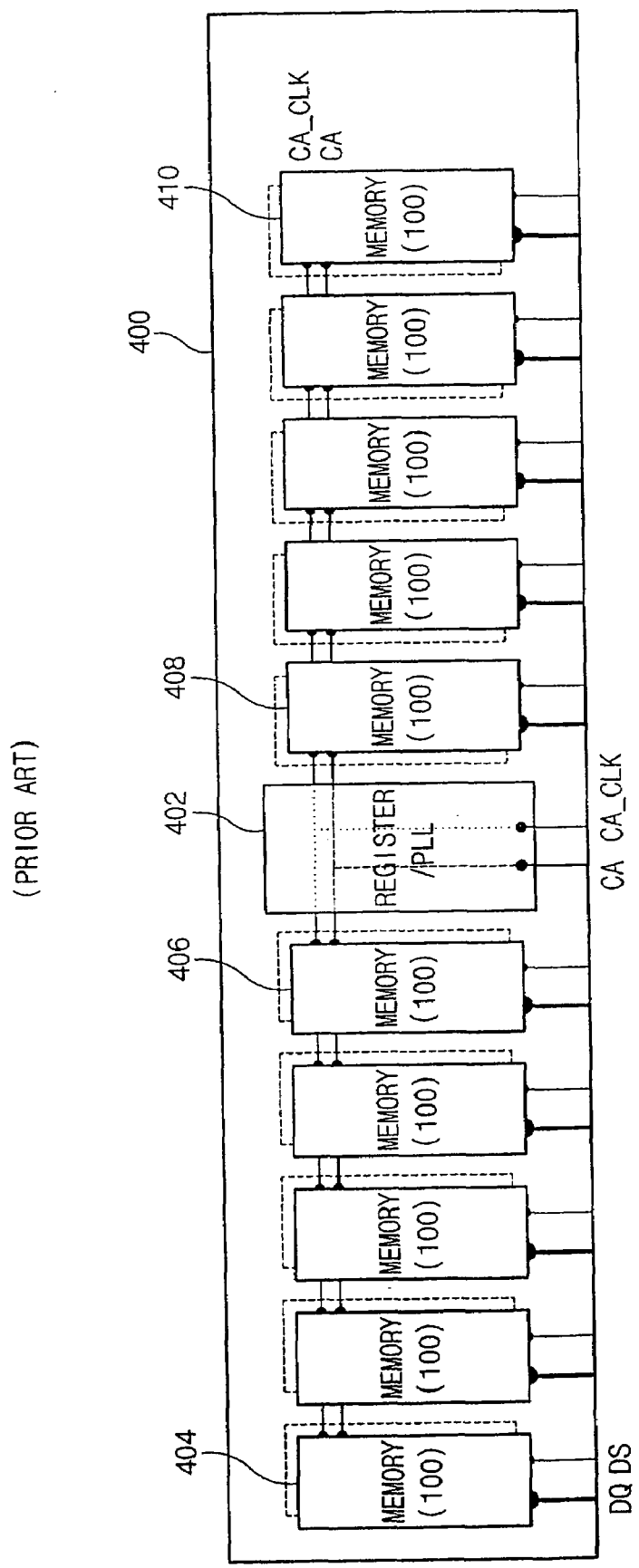
FIG. 4 illustrates a memory module that includes the conventional semiconductor memory device shown in FIG. 1.
Figure 5A:
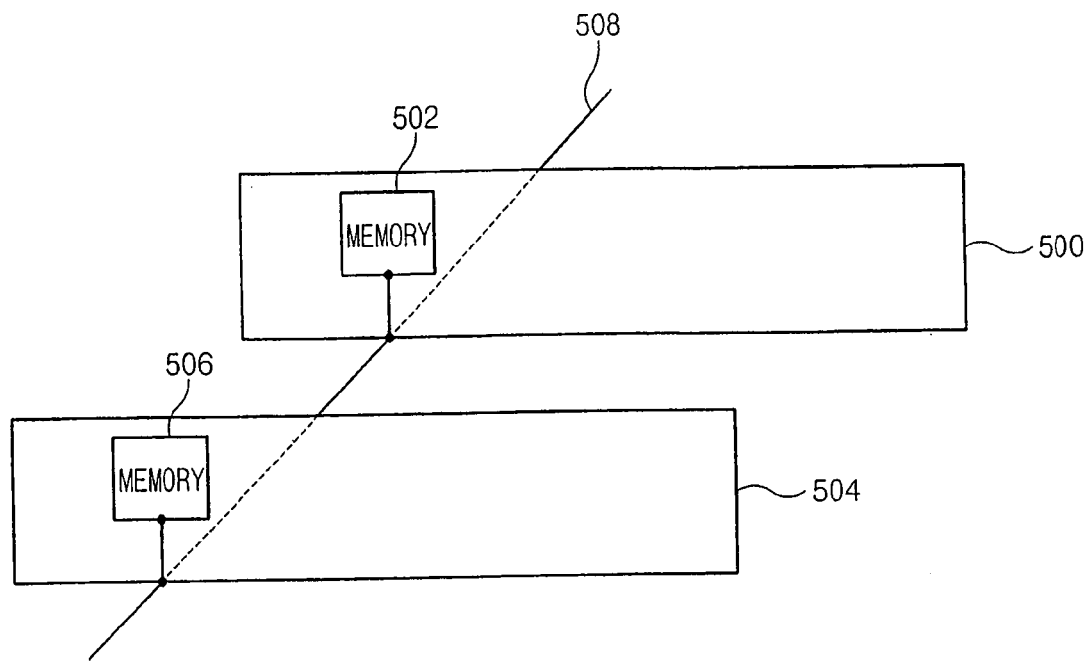
FIG. 5A illustrates structure of a stub bus or a point-to-point bus between memory modules.
Figure 5B:
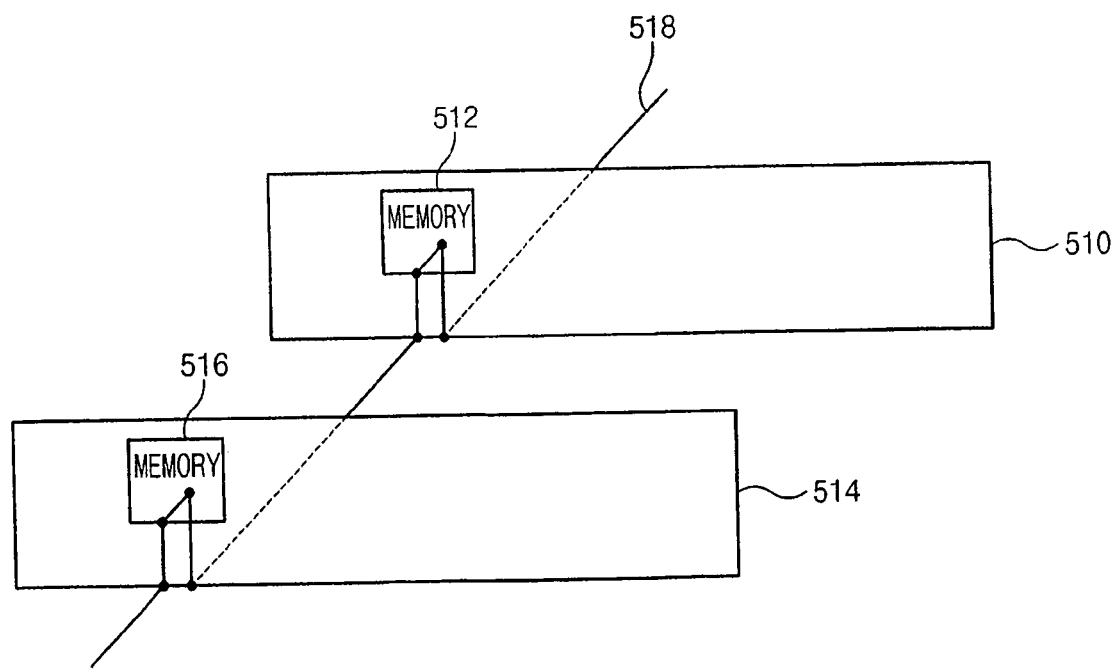
FIG. 5B illustrates structure of a short-loop-through bus between memory modules.
Figure 6:
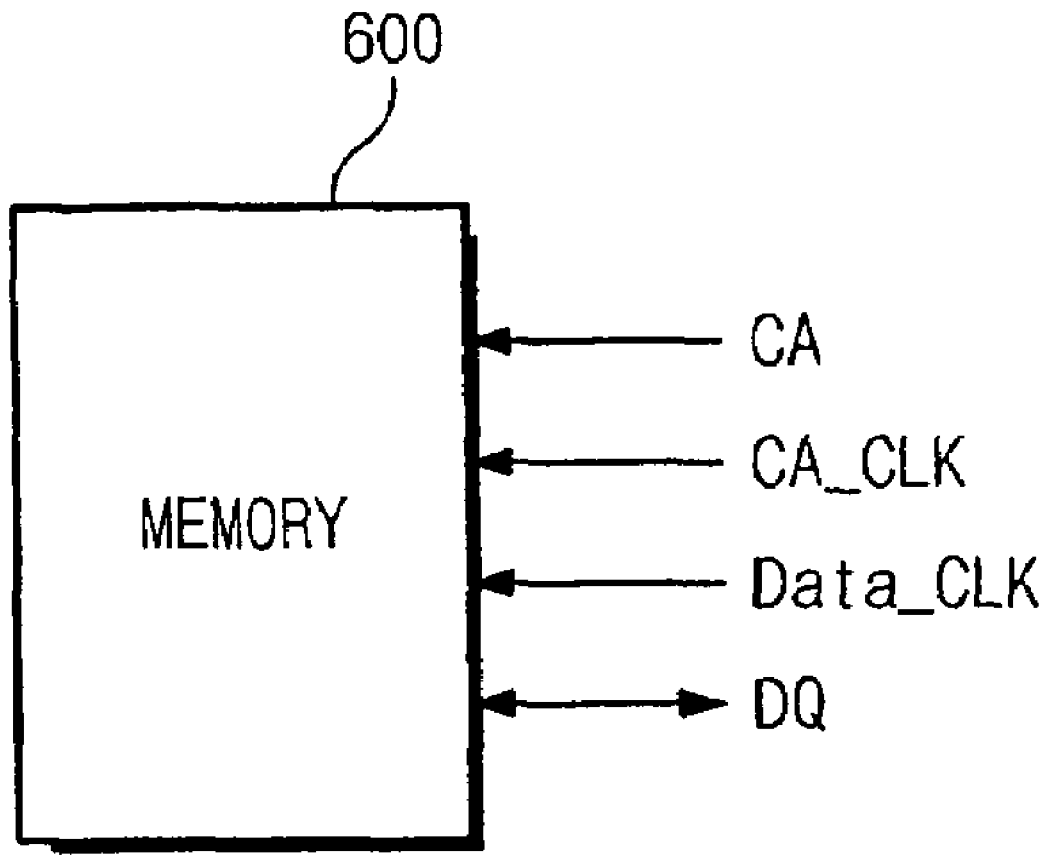
FIG. 6 contains a block diagram illustrating a semiconductor memory device of the present invention performing data input/output operations in synchronization with a free-running clock.

FIG. 6 illustrates a semiconductor memory device of the present invention in which data are inputted or outputted in synchronization with a free-running clock.

Referring to FIG. 6, the semiconductor memory device 600 of the present invention receives an external command/address signal CA using a first external clock signal CA_CLK, and performs input/output operations of data DQ using a second external clock signal Data_CLK when a data write or read command Write or Read is applied.

Figure 7A:
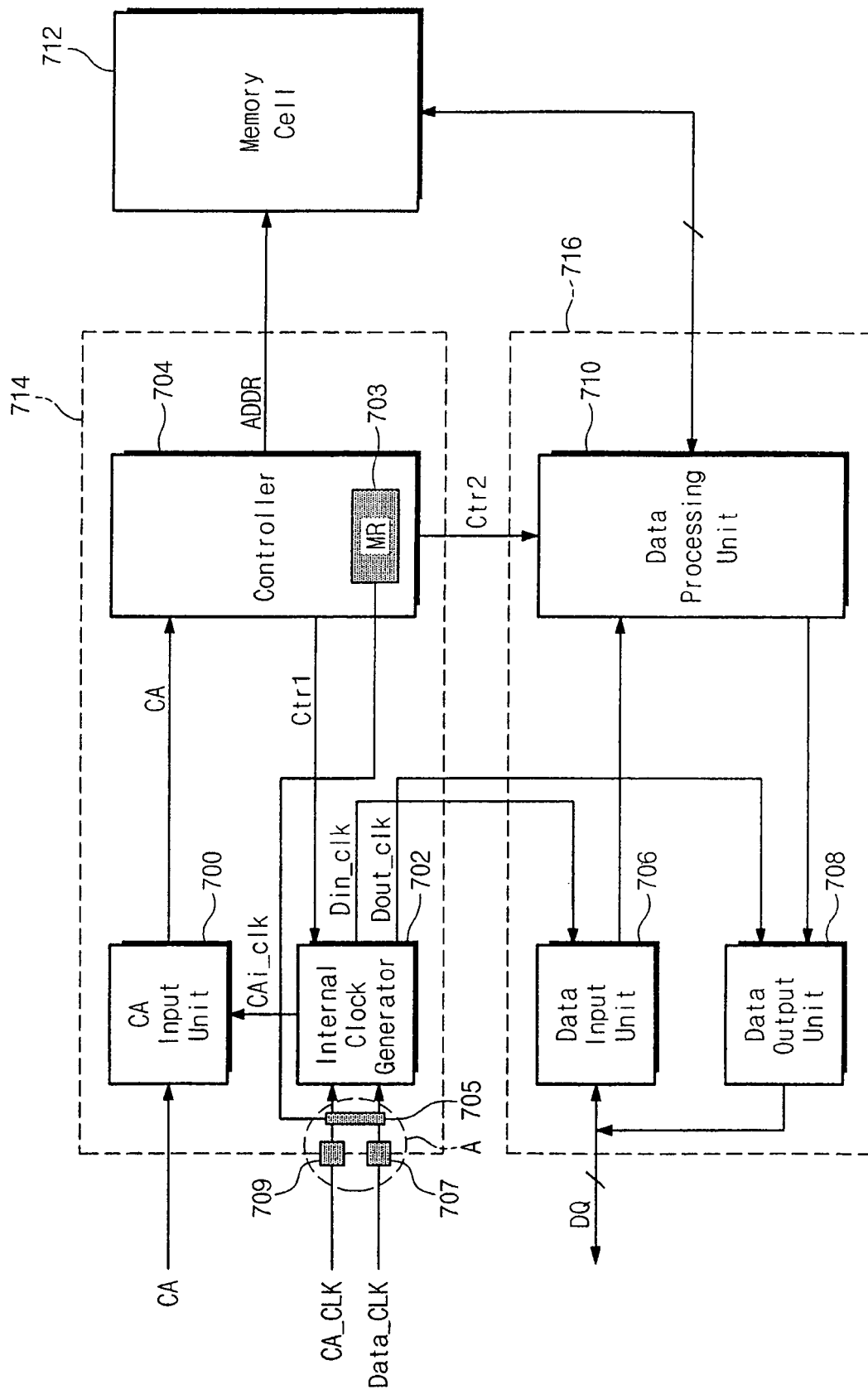
FIG. 7A is a detailed block diagram illustrating an embodiment of a semiconductor memory device shown in FIG. 6.

FIG. 7A is a detailed block diagram of an embodiment of a semiconductor memory device shown in FIG. 6. Referring to FIG. 7A, a command/address input unit (CA input unit) 700 transfers an external command/address signal CA to the inside of the memory device 600 in synchronization with a predetermined internal clock signal CAi_CLK inputted from an internal clock generator 702.

The internal clock generator 702 generates a plurality of internal clocks in response to a command/address clock CA_CLK and external data clock Data_CLK. More particularly, the internal clock generator 702 generates an internal command/address clock CAi_clk in response to the CA_CLK applied from the exterior, and generates a data input internal clock Din_clk for inputting data according to a predetermined control signal Ctr1 inputted from a controller 704 in response to the Data_CLK signal, or generates a data output internal clock Dout_clk for outputting data. That is, when a write command Write is inputted from the exterior through a command/address input unit 700, the internal clock generator 702 generates a Din_clk for data input. When a read command Read is inputted from the exterior through a command/address input unit 700, the internal clock generator 702 generates a Dout_clk for data output. Din_clk may be a plurality of clock signals having different phases on conditions (that the input data includes a preamble).

The controller 704 generates control signals Ctrl and Ctr12 for controlling a read or write operation of the memory device according to a command/address signal CA inputted from the command/address input unit 700, and transfers address signal ADDR to a memory cell 712. The controller 704 includes a mode register 703 for setting and controlling various operation options of the memory.

A data processing unit 710 supplies a path for inputting and outputting data between the memory cell 712 and either of a data input unit 706 and a data output unit 708 according to an operation control signal Ctr2 inputted from the controller 704. The data processing unit 710 can detect the start and end of data when inputting data including information on CAS latency and burst data length BL and not including a preamble.

Figure 8:
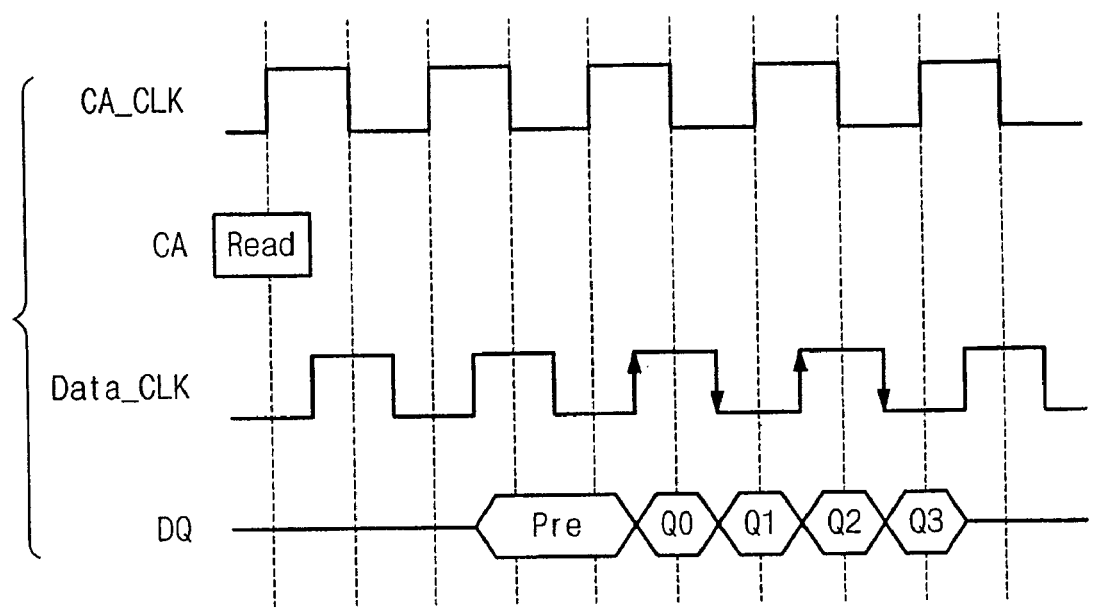
FIG. 8 is a timing diagram of signals when the semiconductor memory device of the present invention reads data.

The data output unit 708 transferring data inputted from the data processing unit 710 to the exterior in synchronization with Dout_clk when reading data. FIG. 8 is a time chart of signals when the semiconductor memory device of the present invention reads data. As shown in FIG. 8, the semiconductor memory device 600 of the present invention receives a read command Read, a command signal CA, from the exterior in synchronization with CAi_clk when reading data, and outputs data to the exterior in synchronization with Dout_clk signal. A preamble portion Pre indicating the start of data is added to the header of the data. To do this, the data output unit 708 includes a preamble generator (not shown) that generates a preamble indicating the start of data and adds the preamble to the head of the outputted data.

FIGS. 9A to 9E illustrate embodiments of preambles in accordance with the invention. As shown in FIGS. 9A to 9E, the preamble can be implemented in various ways.

Figure 9A:
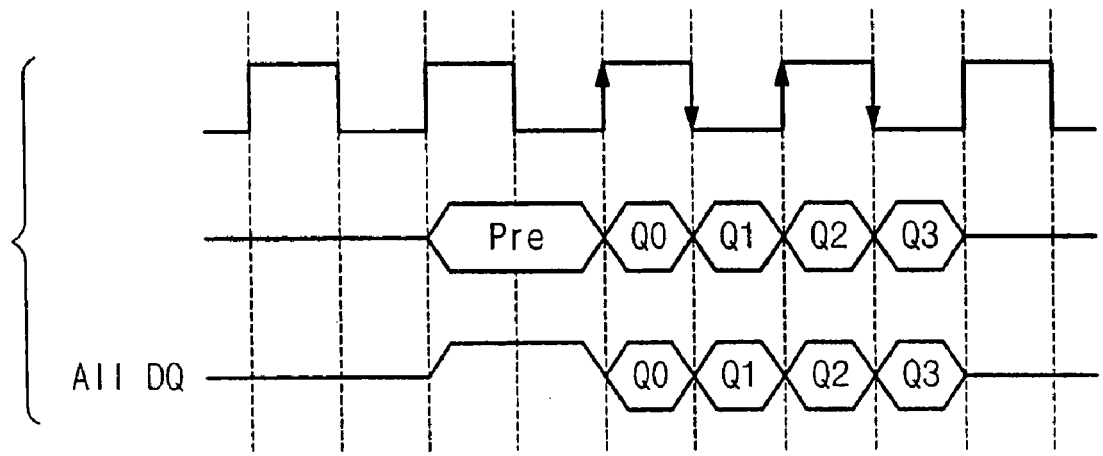
FIGS. 9A to 9E illustrate embodiments of preambles used in the present invention.
Figure 9B:
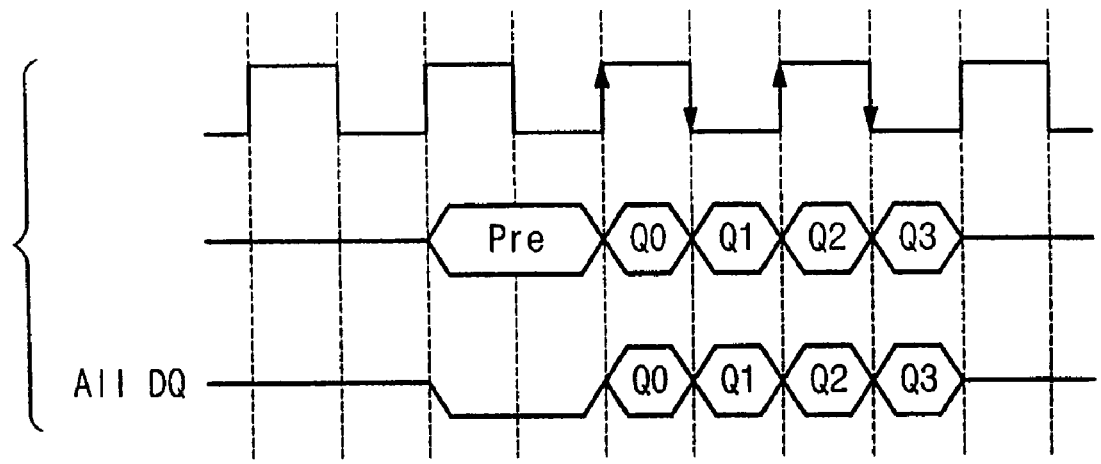

In one example, a preamble of the same level can be added to the header of data outputted through all data-lines. That is, as shown in FIG. 9A, the preamble of a high level is added to the header of data outputted through all data lines. Also, as shown in FIG. 9B, the preamble of a low level is added to the header of data outputted through all data lines.

Figure 9C:
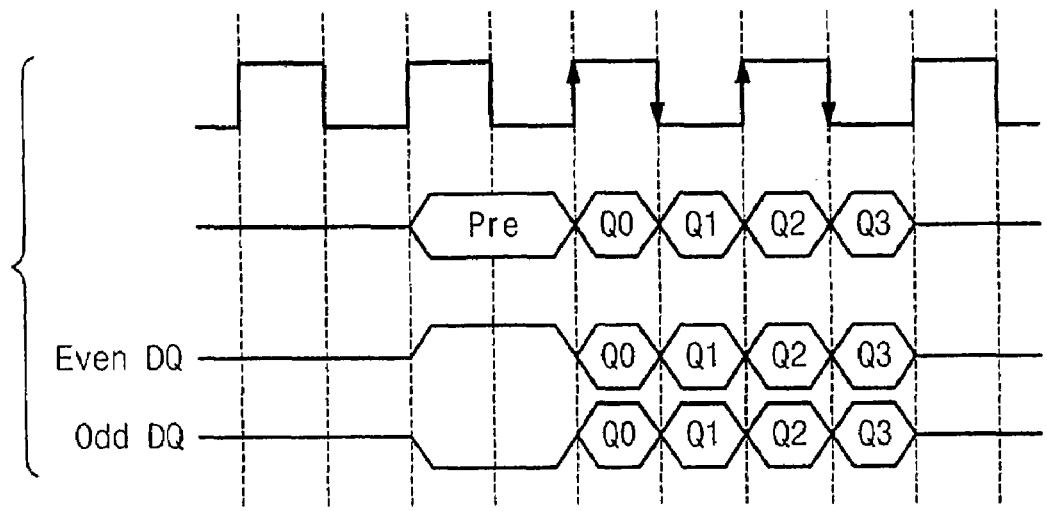
Figure 9D:
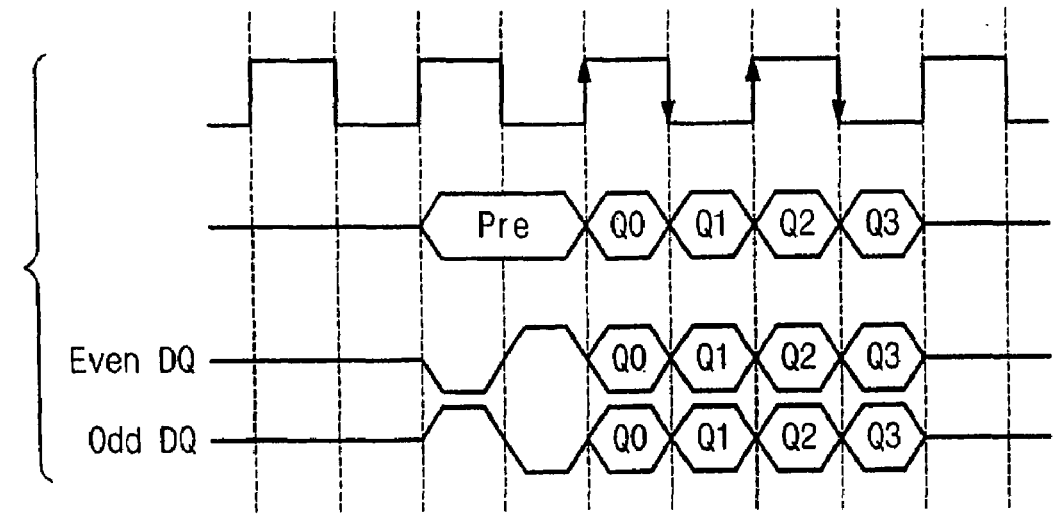
Figure 9E:
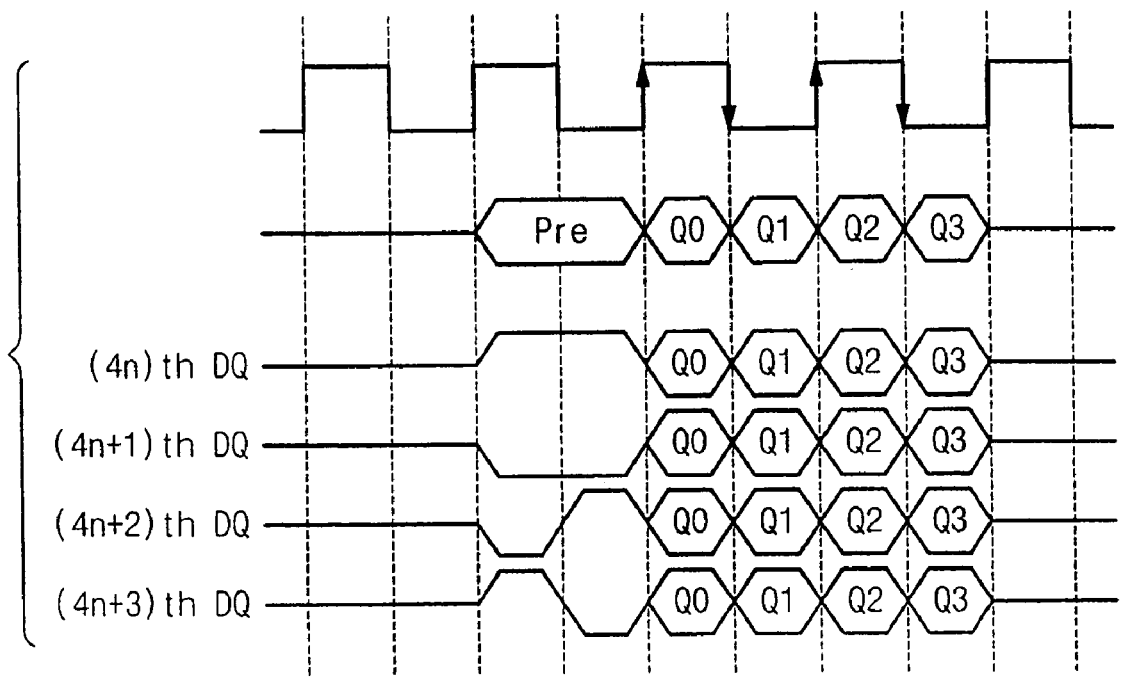

In another example, preambles of different levels can be added to the header of data outputted through neighboring data lines. That is, as shown in FIGS. 9C and 9D, data lines are classified as being even data lines or odd data lines, and the preambles of different levels are applied to each of the data lines. Also, as shown in FIG. 9E, the data lines are classified into four groups, namely, a $(4n)_{th}$ line, a $(4n+1)_{th}$ line, a $(4n+2)_{th}$ line and a $(4n+3)_{th}$ line, where n=0, 1, 2, ..., and the preambles of different levels by each group is applied.

The device receiving data to which a preamble is added requires a circuit for detecting the preamble and latching data essentially. The configuration of the circuit depends on the type of the preambles.

Figure 10A:
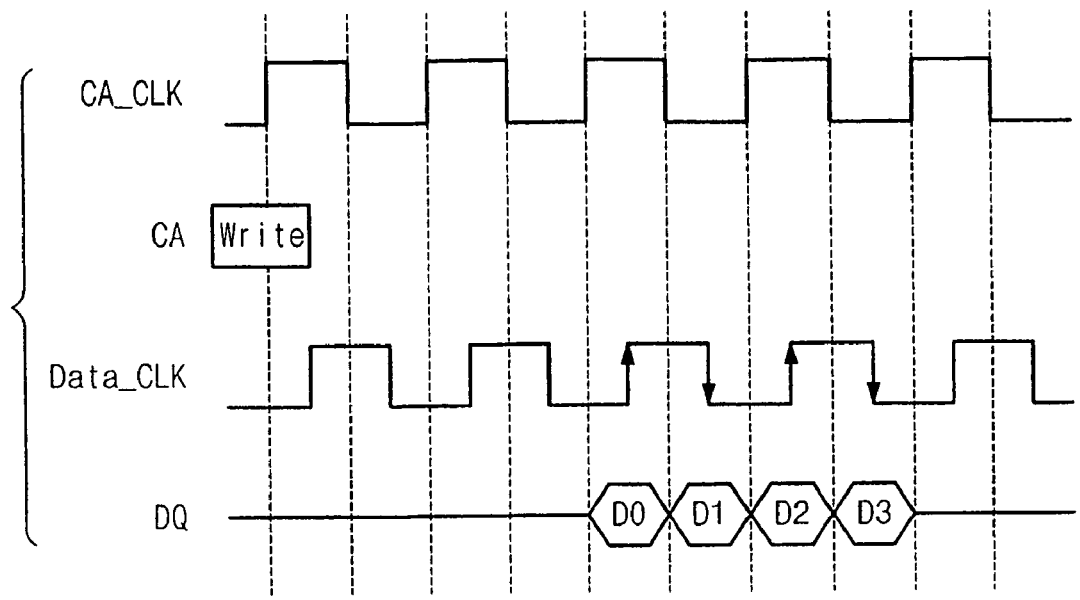
FIG. 10A is a timing diagram of a signal when writing data excluding the preamble in the semiconductor memory device of the present invention.

The data input unit 706 transfers data inputted from the exterior to the data processing unit 710 in synchronization with Din_clk signal. FIG. 10A is a time chart of a signal when writing data excluding the preamble in the semiconductor memory device of the present invention. As shown in FIG. 10A, the semiconductor memory device of the present invention receives a write command Write that is a command signal CA from the exterior in synchronization with the CAi_clk signal when writing data, and receives data from the exterior in synchronization Din_clk. In this case, the start and end of the data can be found using information on the CAS latency CL and burst length BL. The CAS latency CL is defined as the clock number from a command input to data input. The burst length BL is defined as the length of the inputted data. To the reference, the data shown in FIG. 10A is the case that CAS latency is 2 (CL=2) and the burst length 4 (BL=4). However, if a preamble is added to data inputted from the exterior, circuit for latching the data to which the preamble is added should be implemented in the semiconductor memory device.

It is the same to an external master for receiving data including a preamble and processors.

Figure 10B:
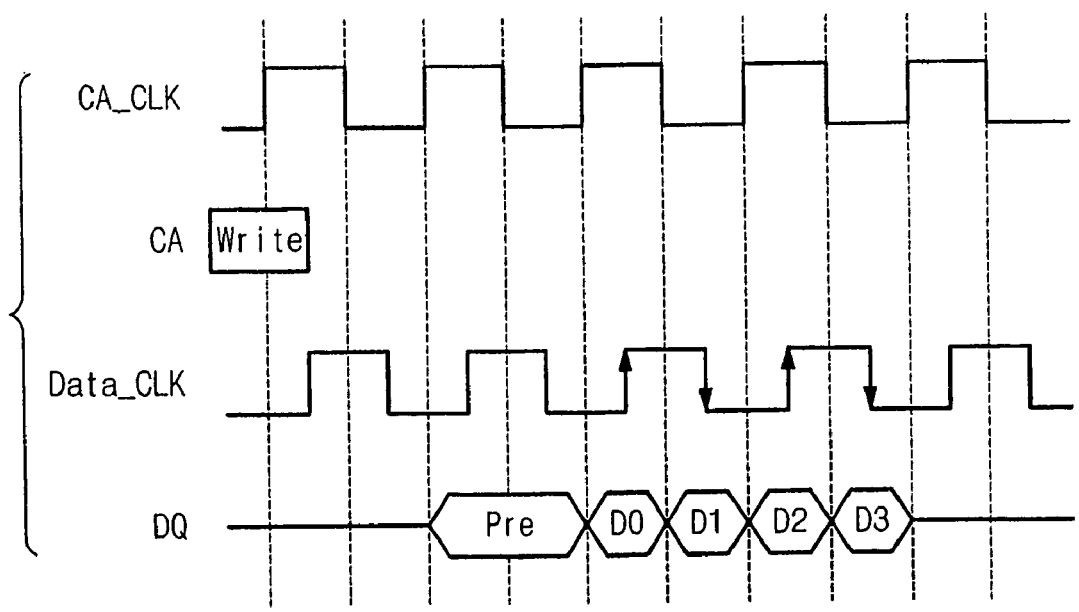
FIG. 10B is a timing diagram of a signal when writing data including the preamble in the semiconductor memory device of the present invention.
Figure 11:
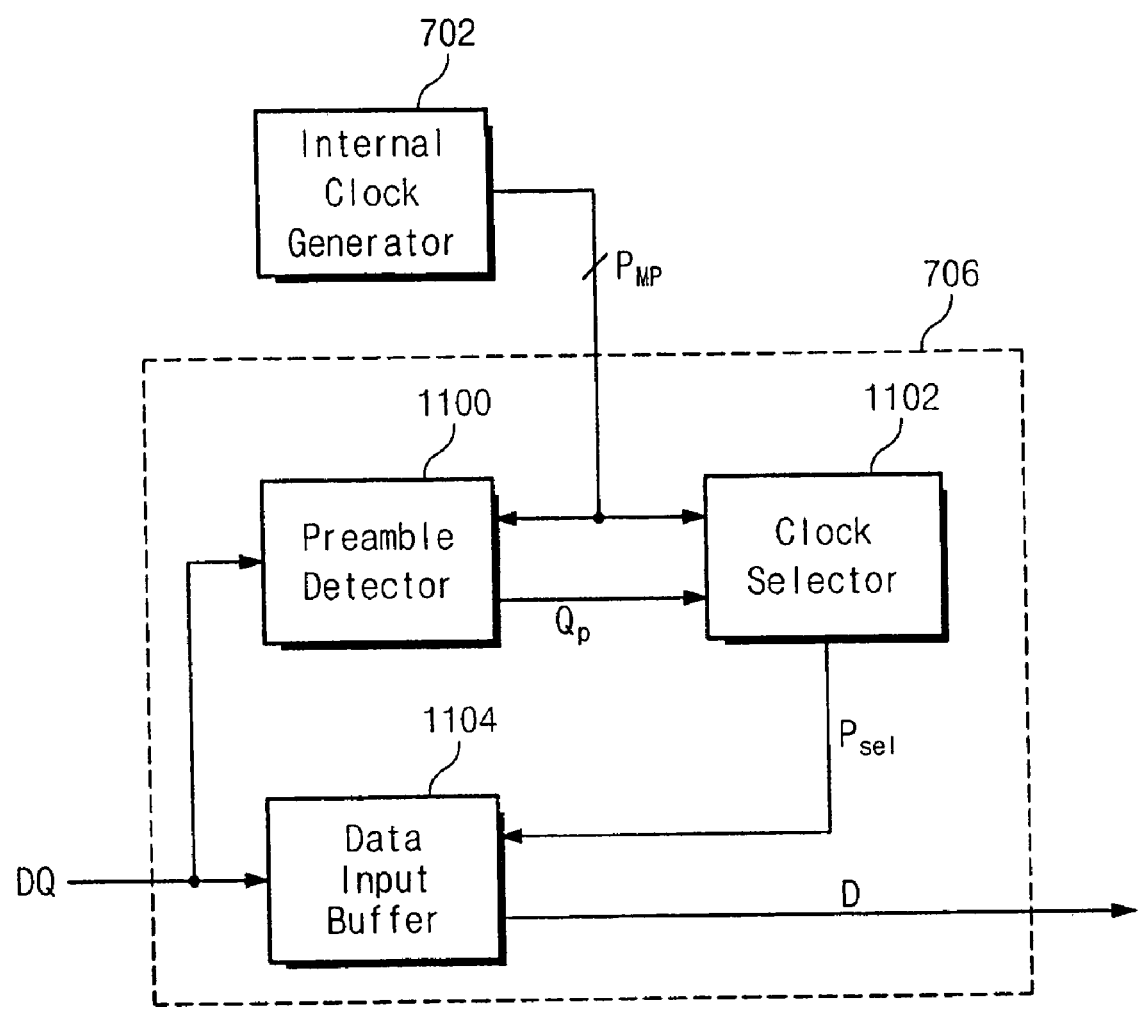
FIG. 11 is a block diagram illustrating an embodiment of a data input unit of the present invention for latching data including a preamble.

FIG. 10B is a time chart of a signal when writing data including the preamble. FIG. 11 is a block diagram illustrating an embodiment of a data input unit of the present invention for latching data including a preamble. As shown in FIG. 11, the circuit for latching the data including a preamble includes a preamble detector 1100 for detecting a preamble of data DQ inputted from the exterior and detecting the start of the data, a clock selector 1102 for selecting a clock signal $P_{SEL}$ suitable to latch inputted data of a plurality of internal clock signals $P_{MP}$ having different phases inputted from the internal clock generator 702, and a data input buffer 1104 for latching the input data DQ in synchronization with the clock signal $P_{SEL}$ inputted from selector.

Figure 12:
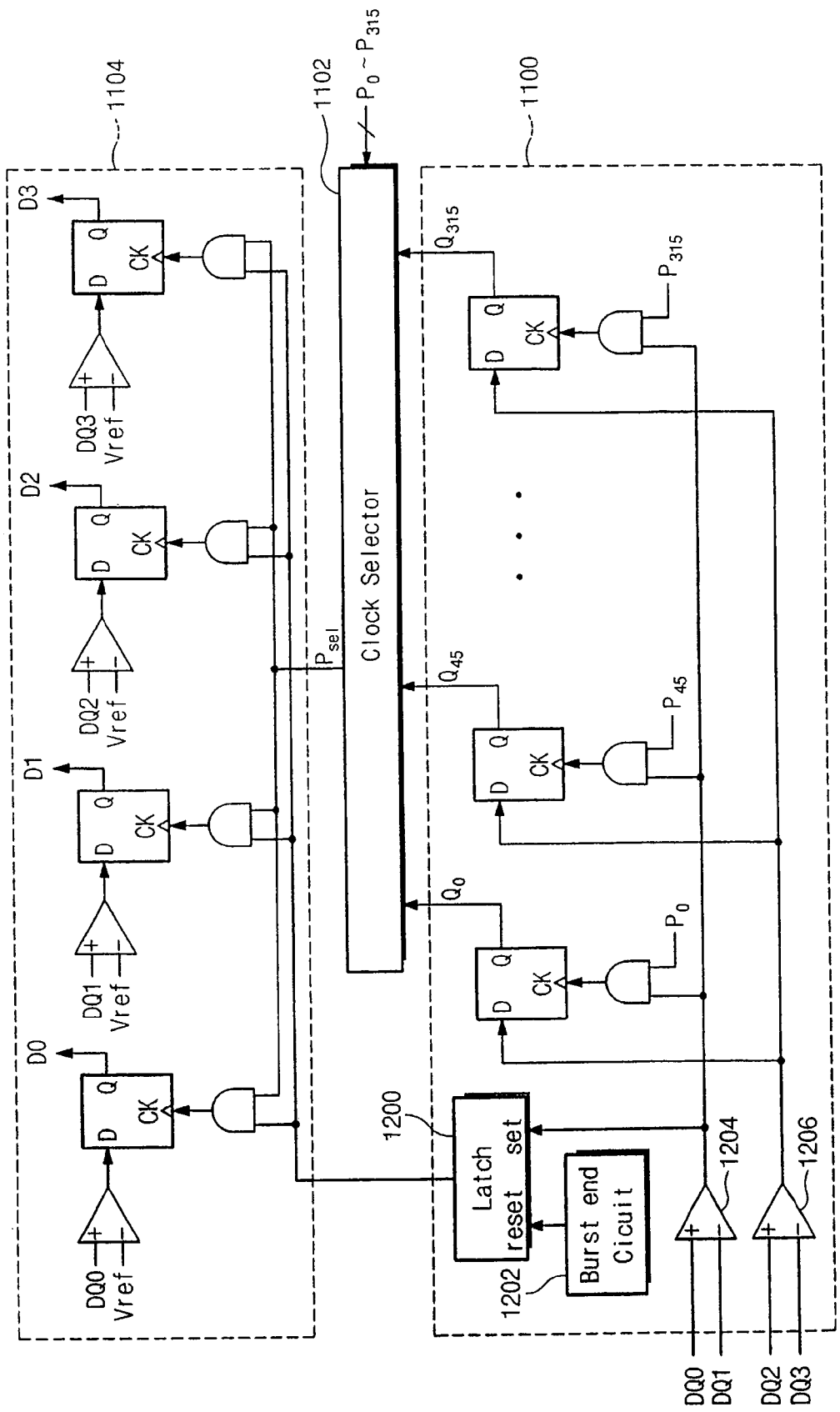
FIG. 12 illustrates an embodiment of a circuit for latching data having a preamble in the form of FIG. 9E.
Figure 13:
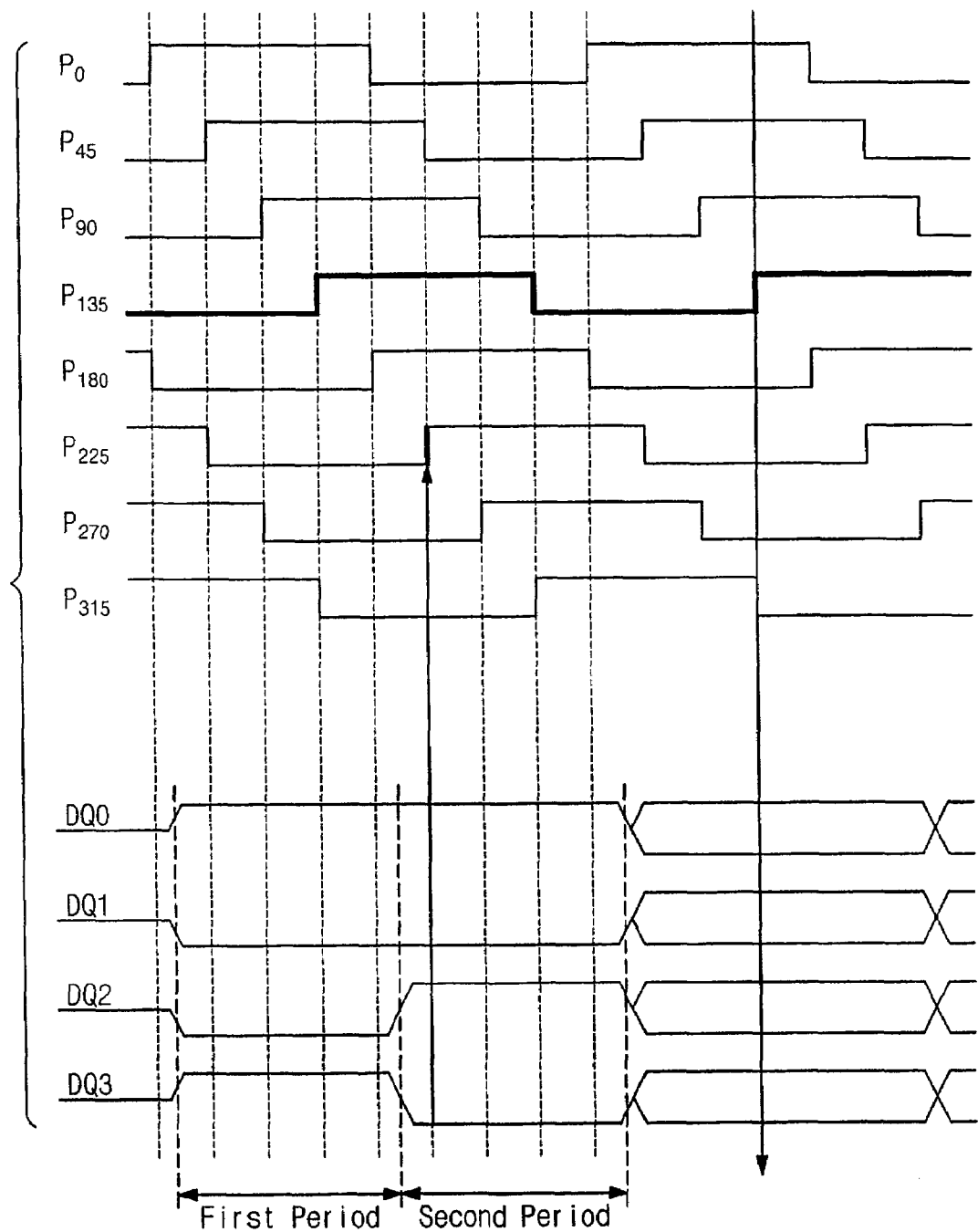
FIG. 13 is a timing diagram illustrating a procedure of selecting a synchronization clock for detecting a preamble and latching data in a circuit diagram of FIG. 12.

FIG. 12 illustrates an embodiment of a circuit for latching data having a preamble in the form of FIG. 9E. FIG. 13 is a time chart illustrating procedure of selecting synchronization clock for detecting a preamble and latching data in a circuit diagram of FIG. 12. Referring to FIGS. 12 and 13, if the preamble as shown in FIG. 9E is applied to amplifiers 1204 and 1206 of a preamble data latch circuit shown in FIG. 12, the output of the first amplifier 1204 is high level in the first period shown in FIG. 13 and both outputs of the first amplifier 1204 and the second amplifier 1206 are high level.

If the output of the first amplifier 1204 is high level in a first period, it is set to supply the data input buffer 1104 with a clock through the latch circuit 1200. The clock signals $P_0$ to $P_{315}$ having different phases are inputted to a clock input stage CK of flip-flops in the preamble detector 1100. Here, inputted clock signals $P_0$ to $P_{315}$ have phase difference of 45° as shown in FIG. 12.

If the output of the second amplifier 1206 is high level in the second period, a signal of high level is inputted to an input stage of flip-flops in the preamble detector 1100. Signals $Q_0$ to $Q_{315}$ are outputted sequentially according to the clock signals $P_0$ to $P_{315}$ having different phases. Referring to FIG. 13, the clock signal that becomes high-level first in the second period is $P_{225}$ and the preamble detector 1100 outputs a signal $Q_{225}$ first through the flip-flop that receives this clock signal $P_{225}$.

The clock selector 1102 detects phase of the first signal $Q_{225}$ inputted by the preamble detector 1100, selects the clock signal $P_{135}$ that leads the first signal $Q_{225}$ in phase by 90° and applies the clock signal $P_{135}$ to the data input buffer 1104. The data input buffer 1104 latches the inputted data DQ0 to DQ3 in synchronization with the clock signal $P_{SEL}=P_{135}$ and stores the latched data in the memory cell 712. Here, a clock signal that leads phase by 90° is selected to change the clock signal at the center of the data valid time as shown in FIG. 13 when latching data.

When the data is inputted completely, a burst end circuit 1202 applies a signal indicative of end of data to the latch circuit 1200 and the latch circuit 1200 resets the flip-flops of the data input buffer 1104.

The circuit for latching a preamble as described above should be implemented in the same way not only in a semiconductor memory device but also) in other devices receiving data including a preamble. The configuration of circuit can be implemented according to the type of the preamble.

Figure 7B:
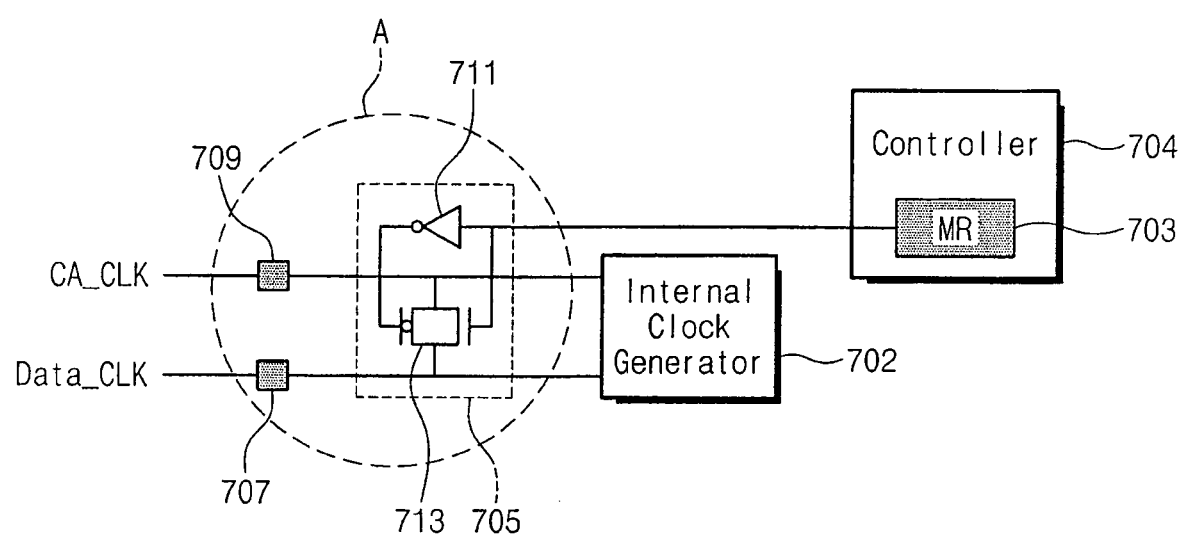
FIG. 7B is a schematic, functional detailed view of section A of FIG. 7A in accordance with an embodiment of the present invention.

In the embodiment described above, two separate clock signals CA_CLK and Data_CLK are inputted so as to receive a command/address signal and data from the exterior. However, if the phase difference between the two clock signals CA_CLK and Data_CLK is small (less than or equal to 0.5 tCK where tCK is one period of a system clock), it is possible to input a command/address signal and to receive and output data only by any one of the two clock signals. In FIGS. 7A and 7B, the controller 704 includes the mode register 703. FIG. 7B is a detailed view of section A of FIG. 7A in accordance with an embodiment of the present invention. In FIGS. 7A and 7B, any one of the clock signals can be selected by setting a mode register set (MRS) 703 included in the controller 704 of the semiconductor memory device. In a system using DRAM, in a case in which the clock supports only one of either the command/address clock CA_CLK or the external data clock Data_CLK, one of the clocks may be controlled by the mode register 703. The mode register selects either one of the clocks or both of the two clocks depending on the system the clock supports. The two clocks CA_CLK and Data_CLK are received at pads 707 and 709. The mode register 703 outputs a control signal to a control circuit 705. According to the control signal being output from the mode register 703, the control circuit 705 controls whether one of the command/address clock CA_CLK and the external data clock Data_CLK or both of the command/address clock CA_CLK and the external data clock Data_CLK are used. The control circuit 705 includes an inverter 711 and a transmission gate 713. In response to the control signal generated by the mode register 703, the internal clock generator 702 generates the plurality of internal clocks in response to either one of the command/address clock CA_CLK and the external data clock Data_CLK or both of the command/address clock CA_CLK and external data clock Data_CLK. When the control signal from the mode register 703 is logic high, the transmission gate 713 is enabled such that the two clocks CA_CLK and Data_CLK are connected, and only one clock is used. When the control signal from the mode register 703 is logic low, the transmission gate 713 is disabled and both clocks are received and used separately by the internal clock generator 702. As described above, when only one of the two clock signals is used, the number of lines for supplying a clock signal can be reduced in configuring a memory module. Especially, since one clock signal is used when the memory module is configured using the hub, the number of lines is reduced, so that the thickness of the memory module is reduced greatly.

Figure 14A:
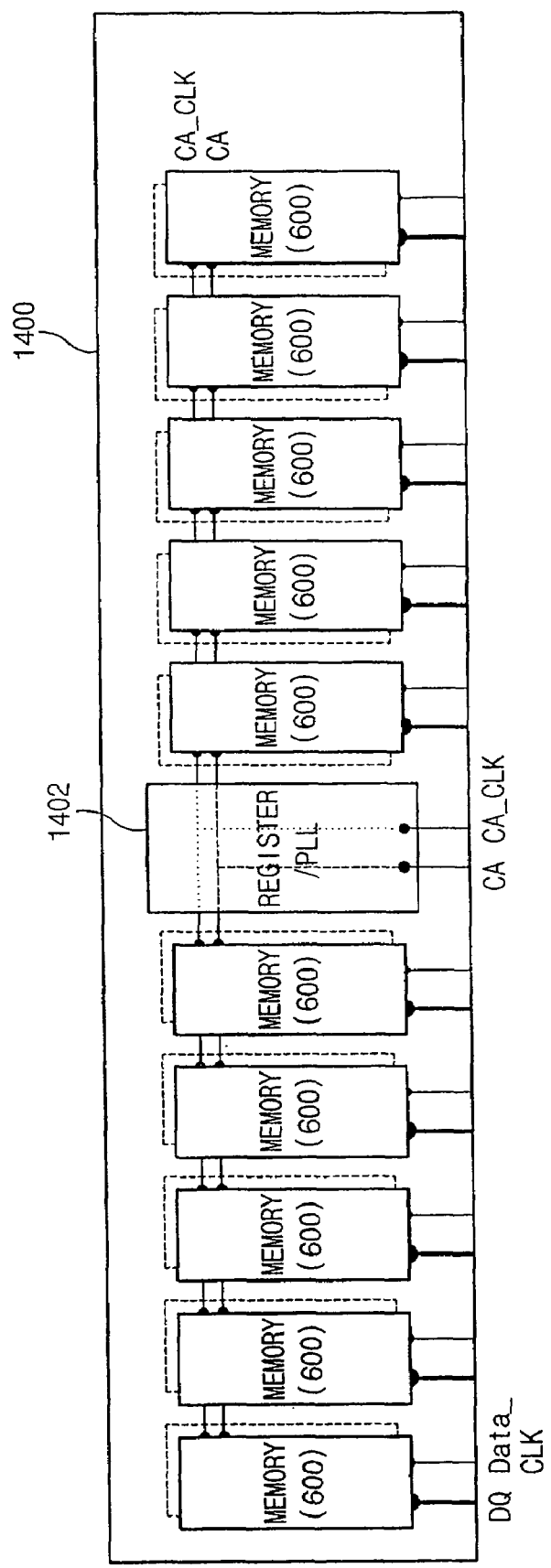
FIG. 14A illustrates an embodiment of a memory module suitable for the structure of a stub bus or a point-to-point bus using the semiconductor device of the present invention.
Figure 14B:
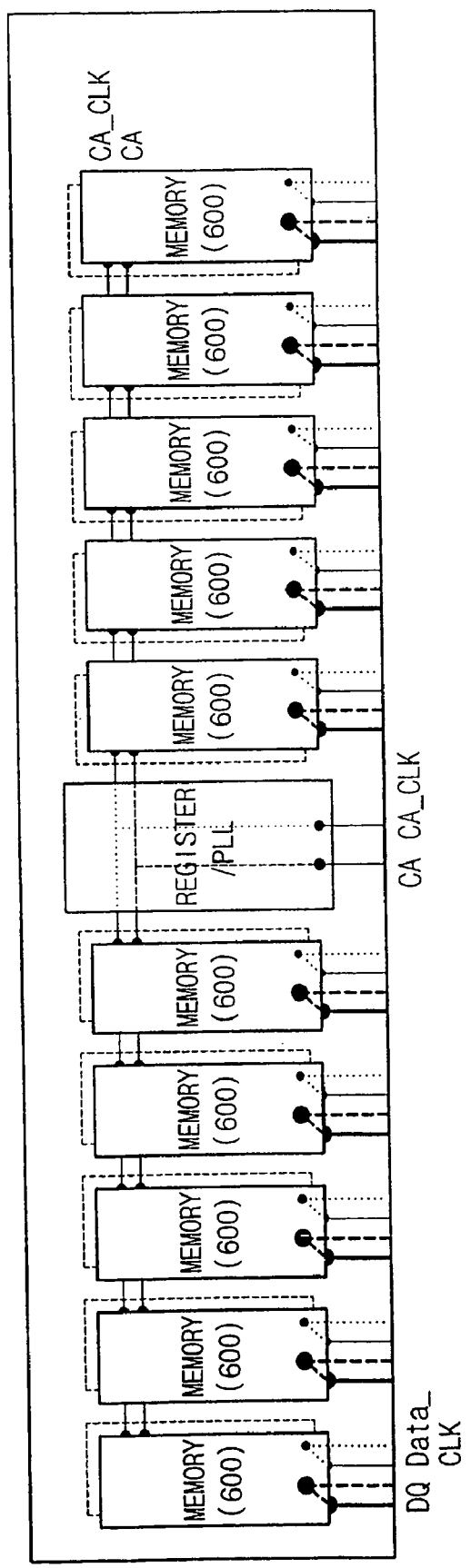
FIG. 14B illustrates an embodiment of a memory module suitable for the structure of a short-loop-through bus using the semiconductor device of the present invention.

FIG. 14A illustrates an embodiment of a memory module suitable for the structure of a stub bus or a point-to-point bus using the semiconductor device of the present invention. FIG. 14B illustrates an embodiment of a memory module suitable for the structure of a short-loop-through bus using the semiconductor device of the present invention. As shown in FIGS. 14A and 14B, lines for data clock Data_CLK that is a free-running clock instead of a data strobe signal for each memory 600 on a memory module 1400 are arranged. A register/PLL circuit 1402 can be implemented on a chipset other than the memory module 1400 on some condition. In this case, the register/PLL circuit 1402 can be omitted from the memory module 1400. When using any one of Data_CLK and CA_CLK, any one of the line for Data_CLK or the line for CA_CLK can be omitted.

Figure 15:
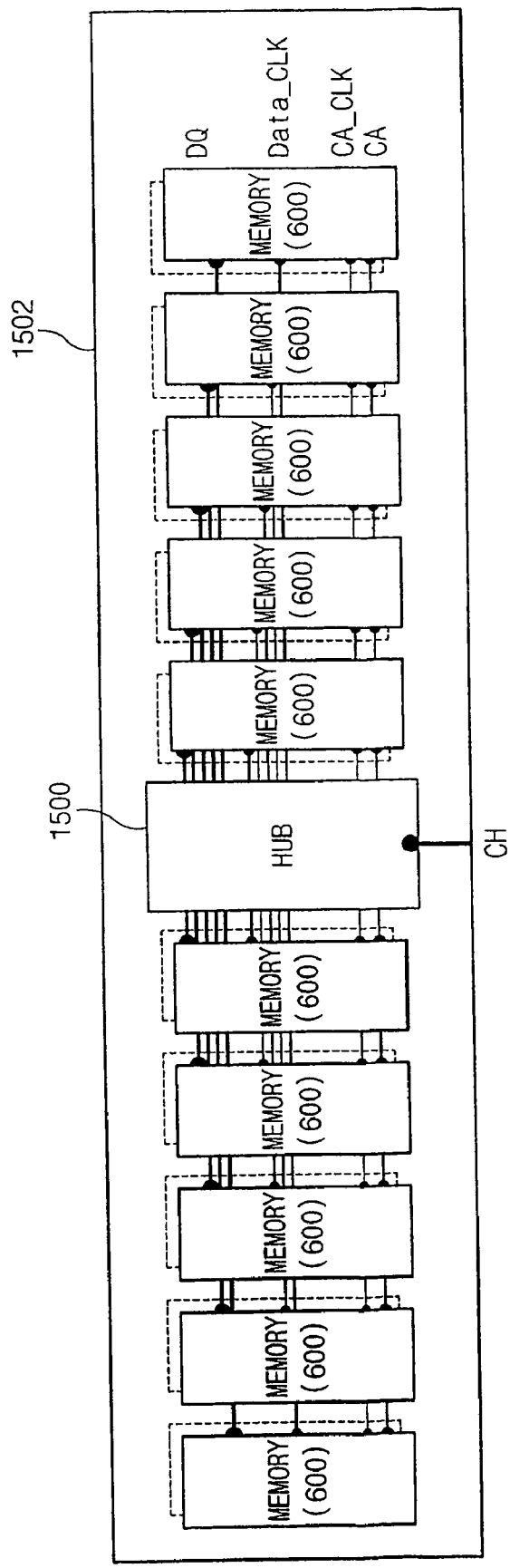
FIG. 15 illustrates another embodiment of a memory module using the semiconductor device of the present invention, that is, another embodiment of a memory module having a hub thereon.

FIG. 15 illustrates another embodiment of a memory module using the semiconductor device of the present invention, that is, another embodiment of a memory module having a hub thereon. As shown in FIG. 15, the memory module 1502 including a hub 1500 is connected to the exterior using a channel CH and communication with the exterior is possible only through the hub 1500 connected to the channel. That is, all the semiconductor memory devices on the memory module 1502 receive various clock signals and data from the exterior through the hub 1500 connected to the channel CH and can output data.

As described above, since a memory module including a hub communicates with the controller or another memory module through the hub on the memory module, all the lines go to the hub. Accordingly, the thickness of the memory module can be thicker depending on the number of the lines. In this case, as described above, the number of lines disposed on the memory module is reduced and the thickness of the memory module can be reduced by using only one clock signal of CA_CLK and Data_CLK.

Figure 16A:
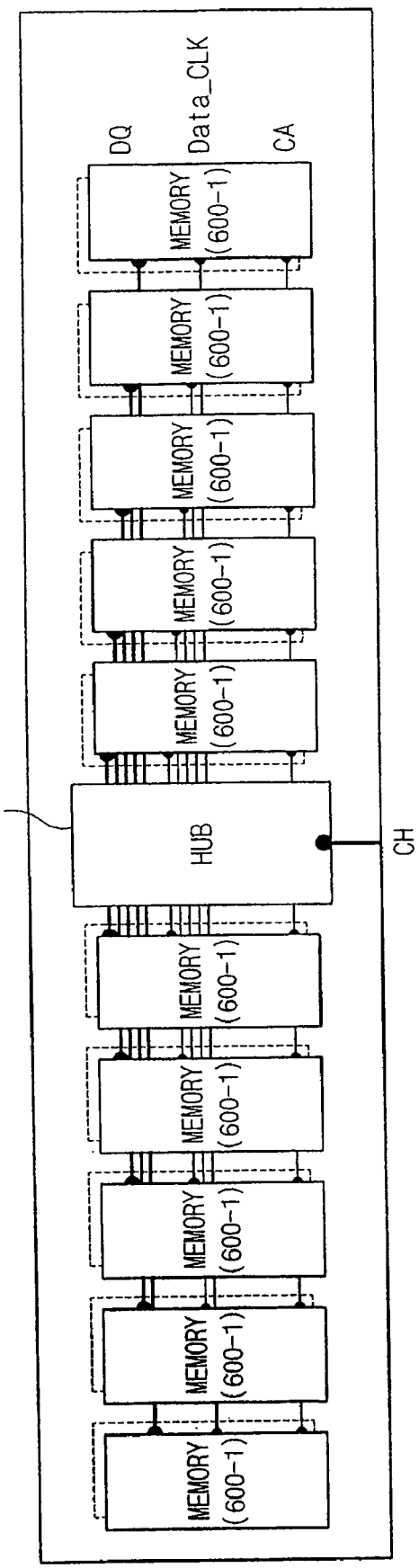
FIG. 16A illustrates an embodiment of a memory module omitting CA_CLK and using Data_CLK in the embodiment of FIG. 15.
Figure 16B:
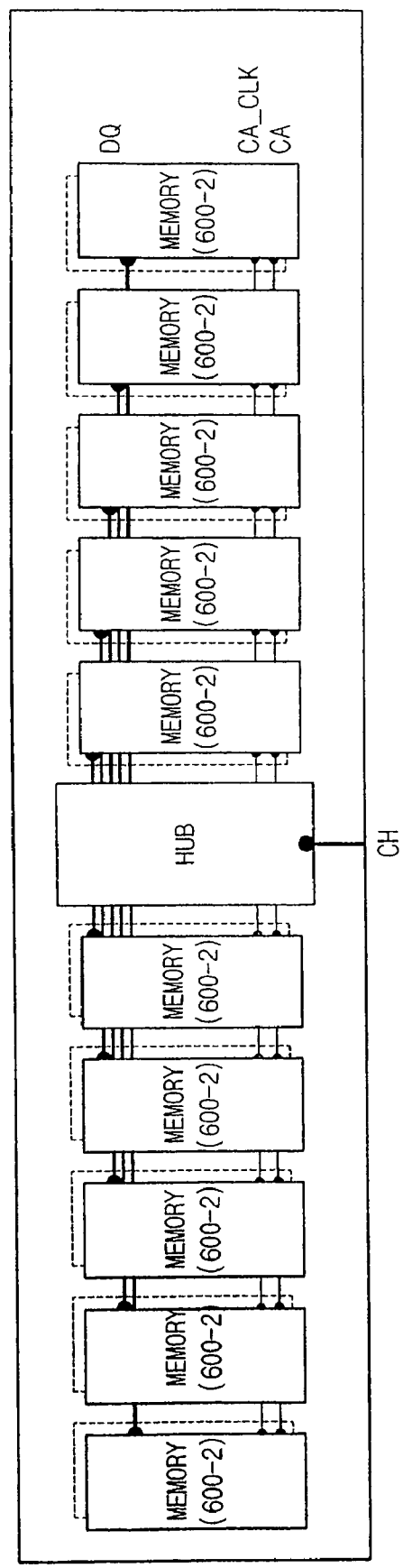
FIG. 16B illustrates an embodiment of a memory module omitting Data_CLK and using CA_CLK in the embodiment of FIG. 15.

FIG. 16A illustrates an embodiment of a memory module when CA_CLK is omitted and Data_CLK is used. FIG. 16B illustrates an embodiment of a memory module when Data_CLK is omitted and CA_CLK is used. As shown in the embodiment illustrated in FIG. 16A, when only Data_CLK is used, the two lines for supplying CA_CLK can be omitted. When only CA_CLK is used, the ten lines for supplying Data_CLK can be reduced.

It will be apparent to those skilled in the art that various modifications and variations can be made in the present invention. Thus, it is intended that the present invention covers the modifications and variations of this invention provided they come within the scope of the appended claims and their equivalents.

As described above, the semiconductor memory device can obtain stable setup of data and hold time margin even in high frequency operation. Time skew due to time delay can be prevented when a memory module is implemented. The number of the lines used to supply a clock signal can be reduced when a memory module is implemented, so that the thickness of the memory module can be reduced greatly.

What is claimed is:

1. A semiconductor memory device comprising:
   a memory cell for storing data;
   an internal clock generator for generating a first internal clock signal, a second internal clock signal or a third internal clock signal in response to a mode control signal;
   a command/address input unit for transferring an externally input command/address signal to inside of the semiconductor memory device in synchronization with the first internal clock signal;
   a controller for outputting a plurality of control signals and an address signal in response to the command/address signal so as to control operation of the semiconductor memory device, the controller having a mode register for generating the mode control signal;
   a control circuit for selecting between a first mode and a second mode in response to the mode control signal, wherein in the first mode the control circuit selects both of an externally input first clock signal and an externally input second clock signal and in the second mode the control circuit selects only one of the externally input first clock signal and the externally input second clock signal;
   a data input unit for receiving data in synchronization with the second internal clock signal;
   a data output unit for outputting data including a preamble in synchronization with the third internal clock signal; and
   a data processing unit for storing data inputted through the data input unit in the memory cell according to the control signals of the control unit, or transferring the data from the memory cell to the data output unit, wherein the preamble is added to a header of the outputted data and is indicative of start of the data;
   wherein:
   in the first mode the internal clock generator generates the first internal clock signal in response to the externally input first clock signal, and generates the second internal clock signal or the third internal clock signal in response to a predetermined control signal and the externally input second clock signal, and
   in the second mode the internal clock generator generates the first internal clock signal in response to the one of the externally input first clock signal and the externally input second clock signal, and generates the second internal clock signal or the third internal clock signal in response to a predetermined control signal and the one of the externally input first clock signal and the externally input second clock signal.

2. The semiconductor memory device of claim 1, wherein the preamble added to each data outputted through the data lines has the same level.

3. The semiconductor memory device of claim 1, wherein the level of the preamble is a high level.

4. The semiconductor memory device of claim 1, wherein the level of the preamble is a low level.

5. The semiconductor memory device of claim 1, wherein the preamble added to data outputted through neighboring data lines among the plurality of data lines has different level.

6. The semiconductor memory device of claim 1, wherein, in the second mode, the semiconductor memory device generates the first to third internal clock signals using the externally input first clock signal.

7. The semiconductor memory device of claim 1, wherein, in the second mode, the semiconductor memory device generates the first to third internal clock signals using the externally input second clock signal.

8. The semiconductor memory device of claim 1, wherein if data including the preamble from the outside, the semiconductor memory device detects the preamble included in the input data unit to latch an input data.

9. The semiconductor memory device of claim 8, wherein the data input unit further comprises:
   a preamble detecting circuit for latching inputted data including the preamble; and
   a data input buffer for inputting an input data in synchronization with the second internal clock signal to the data input unit according to a preamble detection signal from the preamble detection circuit.

10. A semiconductor memory device inputting and outputting data including a preamble, the semiconductor memory device comprising:
   a memory cell for storing data through a plurality of data lines;
   an internal clock generator for generating a first internal clock signal, a second internal clock signal or a third internal clock signal in response to a mode control signal;
   a command/address input unit for transferring an externally input command/address signal to inside of the semiconductor memory device in synchronization with the internal command/address clock signal;
   a controller for outputting a plurality of control signals and an address signal in response to the command/address signal so as to control operation of the semiconductor memory device, the controller having a mode register for generating the mode control signal;
   a control circuit for selecting between a first mode and a second mode in response to the mode control signal, wherein in the first mode the control circuit selects both of an externally input first clock signal and an externally input second clock signal and in the second mode the control circuit selects only one of the externally input first clock signal and the externally input second clock signal;

a data input unit for receiving data including a preamble in synchronization with any one of the plurality of internal clock signals;

a data output unit for outputting data including a preamble in synchronization with any one of the plurality of internal clock signals; and a data processing unit for storing data inputted through the data input unit in the memory cell according to a control signal of the control unit, or transferring the data from the memory cell to the data output unit, wherein the data output unit comprises a preamble generator for generating the preamble and adding the preamble to the output data, and wherein:

in the first mode the internal clock generator generates the first internal clock signal in response to the externally input first clock signal, and generates the second internal clock signal or the third internal clock signal in response to a predetermined control signal and the externally input second clock signal, and in the second mode the internal clock generator generates the first internal clock signal in response to the one of the externally input first clock signal and the externally input second clock signal, and generates the second internal clock signal or the third internal clock signal in response to a predetermined control signal and the one of the externally input first clock signal and the externally input second clock signal.

11. The semiconductor memory device of claim 10, wherein the data input unit comprises:

a preamble detector for detecting a preamble of inputted data and generating a preamble detecting signal;

a clock selector for receiving the plurality of internal clock signals and selecting and outputting one of the plurality of internal clock signals in response to the preamble detecting signal; and a data input buffer for receiving inputted data in synchronization with the internal clock signal selected by the clock selector.

12. The semiconductor memory device of claim 11, wherein the plurality of internal clock signals have different phases from each other.

13. The semiconductor memory device of claim 12, wherein the plurality of internal clock signals have phase difference of 45°.

* * * * *